United States Patent
Wang et al.

(10) Patent No.: US 9,876,606 B2
(45) Date of Patent: Jan. 23, 2018

(54) TRANSMITTING DEVICE, RECEIVING DEVICE, AND METHODS PERFORMED THEREIN

(71) Applicant: Telefonaktiebolaget LM Ericsson (publ), Stockholm (SE)

(72) Inventors: Yi-Pin Eric Wang, Fremont, CA (US); Leif Wilhelmsson, Dalby (SE); Bo Hagerman, Tyresö (SE); Per Skillermark, Årsta (SE); Pontus Arvidson, Stockholm (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 32 days.

(21) Appl. No.: 14/906,228

(22) PCT Filed: Oct. 23, 2015

(86) PCT No.: PCT/SE2015/051125
§ 371 (c)(1),
(2) Date: Jan. 19, 2016

(87) PCT Pub. No.: WO2016/118060
PCT Pub. Date: Jul. 28, 2016

(65) Prior Publication Data
US 2016/0373211 A1    Dec. 22, 2016

Related U.S. Application Data

(60) Provisional application No. 62/105,245, filed on Jan. 20, 2015.

(51) Int. Cl.
*H03M 13/00* (2006.01)
*H04L 1/00* (2006.01)
(Continued)

(52) U.S. Cl.
CPC ...... *H04L 1/0041* (2013.01); *H03M 13/2789* (2013.01); *H04L 1/0071* (2013.01);
(Continued)

(58) Field of Classification Search
None
See application file for complete search history.

(56) References Cited

U.S. PATENT DOCUMENTS

| 5,122,875 | A | * | 6/1992 | Raychaudhuri | ...... H04N 5/4401 |
| | | | | | 348/390.1 |
| 5,995,707 | A | * | 11/1999 | Lee | ........................ H04N 5/783 |
| | | | | | 386/314 |

(Continued)

FOREIGN PATENT DOCUMENTS

| EP | 1 017 175 A1 | 7/2000 |
| EP | 1 968 271 A2 | 9/2008 |

OTHER PUBLICATIONS

International Search Report and Written Opinion of the International Searching Authority, Application No. PCT/SE2015/051125, dated Jan. 27, 2016.

(Continued)

*Primary Examiner* — Daniel McMahon
(74) *Attorney, Agent, or Firm* — Sage Patent Group

(57) ABSTRACT

A transmitting device encodes information bits of a first type of information and a second type of information into a codeword. The transmitting device interleaves the encoded information bits of the first type of information according to a first interleaving pattern and the encoded information bits of the second type of information according to a second interleaving pattern, thereby changing an order of the encoded information bits of at least one of the first type of information and the second type of information in the codeword and generating an interleaved encoded information bit sequence. At least one of the first and the second interleaving pattern is designed to allow the information bits of a first type of information to be decoded without knowing a length of the codeword. The transmitting device then transmits the interleaved encoded information bit sequence to a receiving device.

21 Claims, 13 Drawing Sheets

(51) Int. Cl.
*H03M 13/27* (2006.01)
*H04L 29/06* (2006.01)
*H04B 7/24* (2006.01)

(52) U.S. Cl.
CPC ............ *H04L 1/0086* (2013.01); *H04L 69/22* (2013.01); *H04B 7/24* (2013.01)

(56) References Cited

U.S. PATENT DOCUMENTS

| | | | | |
|---|---|---|---|---|
| 7,191,369 | B2* | 3/2007 | Kawahara | H03M 13/00 711/157 |
| 7,428,667 | B2* | 9/2008 | Kawahara | H03M 13/00 714/701 |
| 7,469,365 | B2* | 12/2008 | Kawahara | H03M 13/00 711/157 |
| 2004/0028126 | A1* | 2/2004 | Inokuchi | G10L 19/008 375/240 |
| 2005/0005223 | A1* | 1/2005 | Kawahara | H03M 13/00 714/755 |
| 2007/0038902 | A1* | 2/2007 | Kawahara | H03M 13/00 714/701 |
| 2007/0038903 | A1* | 2/2007 | Kawahara | H03M 13/00 714/701 |
| 2009/0175349 | A1* | 7/2009 | Ye | H04N 19/70 375/240.23 |
| 2015/0046767 | A1* | 2/2015 | Cideciyan | H03M 13/2909 714/755 |

* cited by examiner

| Preamble | RI | Access Address | PDU | CRC | Term |
|---|---|---|---|---|---|
| (80 us) | (TBD) | (4 Octets) | (2-39 Octets) | (3 Octets) | (3 bits) |

Figure 4

| PDU Header | PDU Payload |
|---|---|
| (2 Octets) | (0-37 Octets) |

Figure 5

TRANSMITTING DEVICE, RECEIVING DEVICE, AND METHODS PERFORMED THEREIN

CROSS REFERENCE TO RELATED APPLICATIONS

This application is a 35 U.S.C. §371 national stage application of PCT International Application No. PCT/SE2015/051125, filed on Oct. 23, 2015, which itself claims priority to U.S. provisional patent Application No. 62/105,245, filed Jan. 20, 2015, the disclosure and content of both of which are incorporated by reference herein in their entireties.

TECHNICAL FIELD

Embodiments herein relate to a transmitting device, receiving device, methods performed therein for wireless communication, a computer program and a computer-readable storage medium. In particular, embodiments herein relate to transmitting information bits to the receiving device in a wireless communication network.

BACKGROUND

In a typical wireless communication network, wireless terminals, also known as mobile stations and/or user equipments (UEs), communicate via a Radio Access Network (RAN) to one or more core networks. The RAN covers a geographical area which is divided into cell areas, with each cell area being served by a base station, e.g., a radio base station (RBS), which in some networks may also be called, for example, a "NodeB (NB)" or "eNodeB (evolved NB)". A cell is a geographical area where radio coverage is provided by the radio base station at a base station site or an antenna site in case the antenna and the radio base station are not collocated. Each cell is identified by an identity within the local radio area, which is broadcast in the cell. Another identity identifying the cell uniquely in the whole mobile network is also broadcasted in the cell. The base stations communicate over the air interface operating on radio frequencies with the wireless terminals within range of the base stations. Transmissions from the wireless terminals to the radio base station are defined as uplink (UL) transmissions and transmissions from the radio base station to the wireless terminal is defined as downlink (DL) transmissions.

In some versions of the RAN, several base stations are typically connected, e.g., by landlines or microwave, to a controller node, such as a radio network controller (RNC) or a base station controller (BSC), which supervises and coordinates various activities of the plural base stations connected thereto. The RNCs are typically connected to one or more core networks.

A Universal Mobile Telecommunications System (UMTS) is a third generation mobile communication system, which evolved from the second generation (2G) Global System for Mobile Communications (GSM). The UMTS Terrestrial Radio Access Network (UTRAN) is essentially a RAN using Wideband Code Division Multiple Access (WCDMA) and/or High Speed Packet Access (HSPA) for user equipments. In a forum known as the Third Generation Partnership Project (3GPP), telecommunications suppliers propose and agree upon standards for e.g. third generation networks and further generations, and investigate enhanced data rate and radio capacity.

Specifications for the Evolved Packet System (EPS) have been completed within the 3GPP and this work continues in the coming 3GPP releases. The EPS comprises the Evolved Universal Terrestrial Radio Access Network (E-UTRAN), also known as the Long Term Evolution (LTE) radio access, and the Evolved Packet Core (EPC), also known as System Architecture Evolution (SAE) core network. E-UTRAN/LTE is a variant of a 3GPP radio access technology wherein the radio base stations are directly connected to the EPC core network rather than to RNCs. In general, in E-UTRAN/LTE the functions of a RNC are distributed between the radio base stations, e.g., eNodeBs in LTE, and the core network. As such, the RAN of an EPS system has an essentially "flat" architecture comprising radio base stations without reporting to RNCs.

In a Bluetooth Special Interest Group (SIG), a new feature, namely, Bluetooth Low Energy (BLE) Long Range is being standardized for applications where the best possible performance and range are required. Forward error correction (FEC) coding and spreading are being introduced to improve the receiver sensitivity and range. To fully take advantage of these improvements, it is desirable that the new features, e.g. coding and spreading, being introduced work well in many different operating scenarios. Since Bluetooth operates in an unlicensed band, interference from other Bluetooth devices or other WiFi devices sharing the same unlicensed band can be expected. In many cases, such interference is bursty in the sense the interference may not last for the entire burst duration of the desired signal. The bursty interference may also occur when the entire desired burst is interfered, but the worst interference only last for a fraction of the burst duration. For such situations, an interleaver may be introduced following the encoder operation to put the data bits into a different order to add robustness to bursty interference.

Interleaver patterns need to be designed carefully to support e.g. BLE Long Range (BLR) operation. For example, a Packet Data Unit (PDU) Header of a packet, which PDU header comprises the information about a PDU Payload length, may be encoded in a same codeword as a PDU payload of the packet. Interleaver pattern however is typically determined by a length of the codeword. The PDU Payload length information and PDU Payload are coded together, and interleaving is used to improve robustness to bursty interference. However, the performance of the wireless communication network may be limited as the receiving device does not know the codeword length and cannot perform decoding operation properly.

SUMMARY

An object of embodiments herein is to provide a mechanism for enabling an improvement of the performance of a wireless communication network.

The object is achieved by a method performed by a transmitting device for transmitting information bits to a receiving device in a wireless communication network. The transmitting device encodes information bits of a first type of information and a second type of information into a codeword. The transmitting device interleaves the encoded information bits of the first type of information according to a first interleaving pattern and the encoded information bits of the second type of information according to a second interleaving pattern, thereby changing an order of at least one of the encoded information bits of the first type of information and the second type of information in the codeword and generating an interleaved encoded information bit sequence. At least one of the first and the second interleaving pattern is designed to allow the information bits of a first type of information to be decoded without knowing a length of the codeword. The transmitting device transmits the interleaved encoded information bit sequence to the receiving device.

Furthermore, the object is achieved by providing a method performed by a receiving device for receiving information bits from a transmitting device in a wireless communication network. The receiving device receives information bits of a first type of information and a second type of information. The receiving device further decodes the received information bits of the first type of information and obtains configuring information from the decoded information bits. The receiving device then configures an interleaving pattern required to decode the information bits of the second type of information based on the obtained configuring information. The receiving device further decodes the information bits of the second type of information received using the configured interleaving pattern.

In addition the object is achieved by providing a transmitting device for transmitting information bits to a receiving device in a wireless communication network. The transmitting device is configured to encode information bits of a first type of information and a second type of information into a codeword. The transmitting device is further configured to interleave the encoded information bits of the first type of information according to a first interleaving pattern and the encoded information bits of the second type of information according to a second interleaving pattern, thereby changing an order of at least one of the encoded information bits of the first type of information and the second type of information in the codeword and generating an interleaved encoded information bit sequence, wherein at least one of the first and the second interleaving pattern is designed to allow the information bits of a first type of information to be decoded without knowing a length of the codeword. Furthermore, the transmitting device is configured to transmit the interleaved encoded information bit sequence to the receiving device.

Additionally, the object is achieved by providing a receiving device for receiving information bits from a transmitting device in a wireless communication network. The receiving device is configured to receive information bits of a first type of information and a second type of information. The receiving device is further configured to decode the received information bits of the first type of information. The receiving device is also configured to obtain a configuring information from the decoded information bits; and to configure an interleaving pattern required to decode the information bits of the second type of information based on the obtained configuring information. The receiving device is then configured to decode the information bits of the second type of information received using the configured interleaving pattern.

A computer program and a computer-readable storage medium having a computer program stored thereon to perform the method herein are also provided.

Embodiments herein provide a solution where the interleaving the encoded information bits adds robustness to bursty interference, i.e. may reduce the effect of bursty interference by changing the order of the encoded information bits, but where the decoding doesn't have to wait for receiving the entire codeword due to the structure of the interleaving pattern as the interleaving comprises interleaving the encoded information bits with the first and the second interleaving pattern of the first and second type of information, respectively. Since the decoding is reduced in time this will result in an improved performance of the wireless communication network.

BRIEF DESCRIPTION OF DRAWINGS

Embodiments will now be described in more detail in relation to the enclosed drawings, in which:

FIG. 4 is a block diagram depicting a packet with information bits;

FIG. 5 is a block diagram depicting a PDU field;

DETAILED DESCRIPTION

Figure 1:
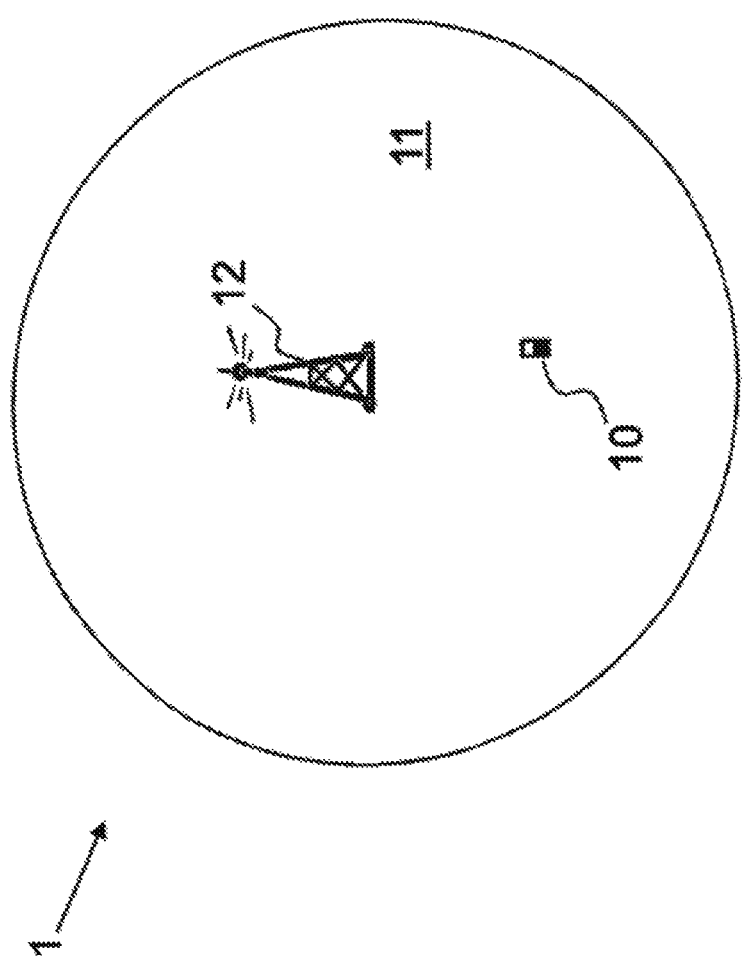
FIG. 1 shows a schematic overview depicting a wireless communication network according to embodiments herein.

Embodiments herein relate to wireless communication networks in general. FIG. 1 is a schematic overview depicting a wireless communication network 1. The wireless communication network 1 comprises one or more RANs and one or more CNs. The wireless communication network 1 may use a number of different technologies, such as Long Term Evolution (LTE), LTE-Advanced, Wideband Code Division Multiple Access (WCDMA), Wi-Fi technology, Bluetooth technology, Global System for Mobile communications/Enhanced Data rate for GSM Evolution (GSM/EDGE), Worldwide Interoperability for Microwave Access (WiMax), or Ultra Mobile Broadband (UMB), just to mention a few possible implementations. The wireless communication network 1 is exemplified herein as a Bluetooth network and BLR is used herein as an example to describe embodiments herein. However, this should not be viewed as a limitation. Embodiments disclosed herein generally apply to systems with similar design and operational requirements.

In the wireless communication network 1, a receiving device 10, exemplified as a wireless device, also known as a communication device, a mobile station, a user equipment and/or a wireless terminal, communicates via a RAN to one or more CNs. It should be understood by the skilled in the art that "wireless device" is a non-limiting term which means any wireless terminal, user equipment, Machine Type Communication (MTC) device, a Device to Device (D2D) terminal, Internet of Things (IoT) device, or node e.g. Personal Digital Assistant (PDA), laptop, mobile phone, sensor, relay, mobile tablets or even a small base station communicating within respective cell.

The wireless communication network 1 covers a geographical area which is divided into cell areas or service areas, e.g. a cell 11 being served by a radio access network node. The radio access network node is an example of a transmitting device 12. The radio access network node may also be referred to as a radio base station such as a NodeB, an evolved Node B (eNB, eNode B), a base transceiver station, Access Point Base Station, base station router, or any other network unit capable of communicating with a wireless device within the cell 11 served by the radio access network node depending e.g. on the radio access technology and terminology used. The radio access network node may serve one or more cells, such as the cell 11.

A cell is a geographical area where radio coverage is provided by radio base station equipment at a base station site or at remote locations in Remote Radio Units (RRU). The cell definition may also incorporate frequency bands and radio access technology used for transmissions, which means that two different cells may cover the same geographical area but using different frequency bands. Each cell is identified by an identity within the local radio area, which is broadcast in the cell. Another identity identifying the cell 11 uniquely in the whole wireless communication network 1 is also broadcasted in the cell 11. The radio access network node communicates over the air or radio interface operating on radio frequencies with the wireless device within range of the radio access network node. The wireless device transmits data over the radio interface to the radio access network node in Uplink (UL) transmissions and the radio access network node transmits data over an air or radio interface to the wireless device in Downlink (DL) transmissions. In exemplified embodiments herein the receiving device 10 is exemplified as a wireless device and the transmitting device 12 is exemplified as a radio access network node. However, the transmitting device 12 may be the wireless device and the receiving device 10 may be the radio access network node, or both the receiving device 10 and the transmitting device 12 may be wireless devices e.g. sensors communicating.

Embodiments herein relate to where the transmitting device 12 encodes information bits of a first type of information, e.g. a PDU Header of a packet, and a second type of information, e.g. PDU Payload of the packet, together to produce a codeword. An interleaver of the transmitting device 12 is used to change the bit ordering in the codeword to add robustness to bursty interference e. may reduce the effect of bursty interference on the codeword or encoded information bits. The interleaving pattern is designed to allow the first type of information bits to be decoded at the receiving device 10 without knowing the number of total encoded information bits. The first type of information, e.g. PDU header, has fixed length, but the second type of information, e.g. PDU Payload length, has variable length. Thus, the number of encoded information bits for the first type of information is fixed. But, the total number of encoded information bits varies. Since the number of encoded information bits for the first type of information is fixed, a fixed interleaving pattern may be used, not dependent of the total number of encoded information bits. In for example BLR at a receiving device, the PDU header may be needed to be decoded without the knowledge of the interleaving pattern. After obtaining the PDU header, the interleaving pattern is then configured to allow the decoding of the entire codeword to proceed. As mentioned earlier, the codeword may comprise information about both the PDU Header and the PDU Payload. The codeword may further comprise other information such as Access Address, Cyclic Redundancy Check (CRC), etc. Thus, embodiments herein add robustness to bursty interference but where the decoding doesn't have to wait for receiving the entire codeword. This leads to a reduced decoding time and an improved performance of the wireless communication network 1.

Figure 2:
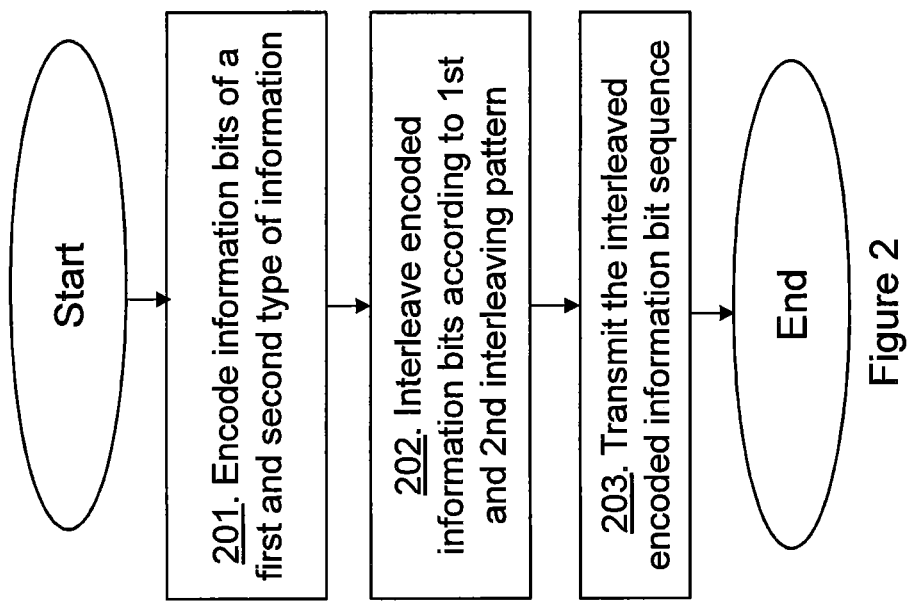
FIG. 2 shows a method performed by a transmitting device according to embodiments herein.

The method actions in the transmitting device 12 for transmitting information bits to the receiving device 10 in the wireless communication network 1 according to some embodiments will now be described with reference to a flowchart depicted in FIG. 2. The actions do not have to be taken in the order stated below, but may be taken in any suitable order. Action 201. The transmitting device 12 encodes information bits of the first type of information and the second type of information into a codeword. The first type of information may comprise information in a PDU Header of a packet. The PDU header carries information about a PDU Payload length. The second type of information may comprise information in a PDU Payload field of the packet. The first type of information may comprise a part of information in the PDU payload and the second type of information may comprise the rest of information in the PDU payload.

Action 202. The transmitting device 12 interleaves the encoded information bits of the first type of information according to a first interleaving pattern, and the encoded information bits of the second type of information according to a second interleaving pattern, thereby changing the order of at least one of the encoded information bits of the first type of information and the second type of information in the codeword and generates an interleaved encoded information bit sequence. This may also be described as the interleaving comprises changing the order of at least one of the encoded information bits of the first type and the second type of information in the code word into an interleaved encoded information bit sequence. At least one of the first and the second interleaving pattern is designed to allow the information bits of a first type of information to be decoded without knowing a length of the codeword. The first interleaving pattern may be independent of the length of the codeword and the second interleaving pattern is dependent of the length of the codeword. The first interleaving pattern may be one that preserves an original ordering of the encoded information bits. The second interleaving pattern may comprise a first subpattern that applies to one or more systematic bits and a second subpattern that applies to one or more redundant bits. Systematic bits are those identical to the original information bits. For example, encoded bit $p_{i,0}$ in FIG. 7 below is a systematic bit. In addition, the first subpattern for the one or more systematic bits may be one that preserves an original ordering of a bit sequence of the one or more systematic bits. According to some embodiments the second interleaving pattern does not interleave encoded information bits associated with one or more of ending information bits of the second type of the information, i.e. one or more of the last information bits of the second type of the information.

Action 203. The transmitting device 12 transmits the interleaved encoded information bit sequence to the receiving device 10.

Figure 3:
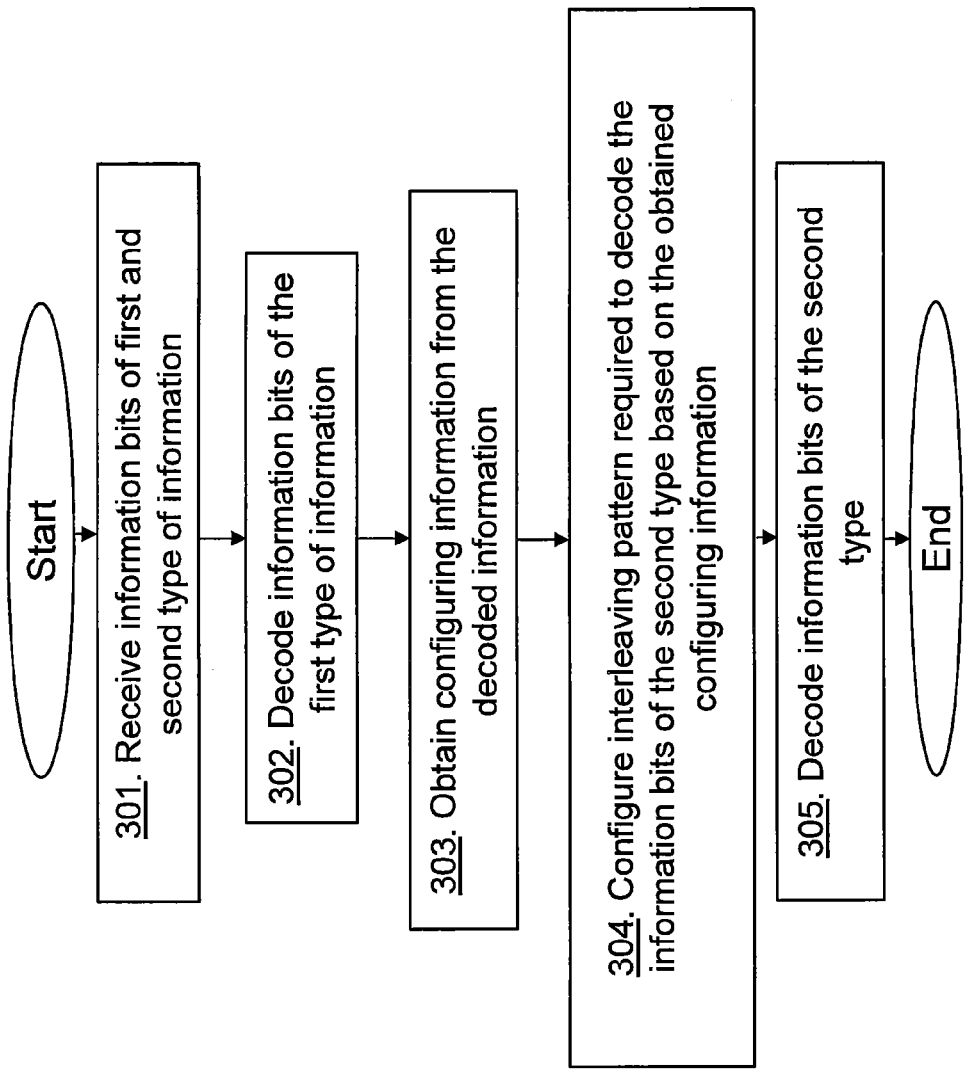
FIG. 3 shows a method performed by a receiving device according to embodiments herein.

The method actions in the receiving device 10 for receiving the information bits from the transmitting device 12 in the wireless communication network according to some embodiments will now be described with reference to a flowchart depicted in FIG. 3. The actions do not have to be taken in the order stated below, but may be taken in any suitable order.

Action 301. The receiving device 10 receives information bits of the first type of information and the second type of information.

Action 302. The receiving device 10 decodes the received information bits of the first type of information.

Action 303. The receiving device 10 obtains a configuring information from the decoded information bits. The obtained configuring information may comprise information of the PDU Payload length.

Action 304. The receiving device 10 configures, based on the obtained configuring information, an interleaving pattern also denoted de-interleaving pattern, e.g. the second interleaving pattern, required to decode the information bits of the second type of information. For example, the PDU payload length may then be used to configure the interleaving pattern to decode the information bits of the second type of information.

Action 305. The receiving device 10 decodes the information bits of the second type of information received using the configured interleaving pattern.

A packet format or BLR burst format is shown in FIG. 4. At the beginning of the burst, there are known symbols, referred to as a Preamble, of 80 μs, used for facilitating initial time synchronization, and in some cases also frequency synchronization. A Rate Indicator (RI) field, to be decided (TBD) in size, is used to indicate the physical layer transmission rate, which determines the coding and spreading scheme for the subsequent fields. An Access Address (AA) field of 4 octets identifies a communication link between the transmitting device 12 and receiving device 10. A PDU field of 2-39 octets includes the PDU Header and PDU Payload as illustrated in FIG. 5. The PDU Header carries the information about the PDU Payload length. A CRC field of 3 octets comprises the CRC bits which allow the receiving device 10 to check whether there is any error in the PDU. A "Term" field of 3 bits comprises terminating bits needed to force an internal state of the convolutional code to end at the all-zero state, or at any pre-agreed upon state between the transmitting device 12 and receiving device. FIG. 5 shows the PDU field comprising the PDU header of 2 octets and the PDU payload of 0-37 octets. According to some embodiments herein the first type of information may comprise the PDU header and the second type of information may comprise the PDU payload.

Figure 6:
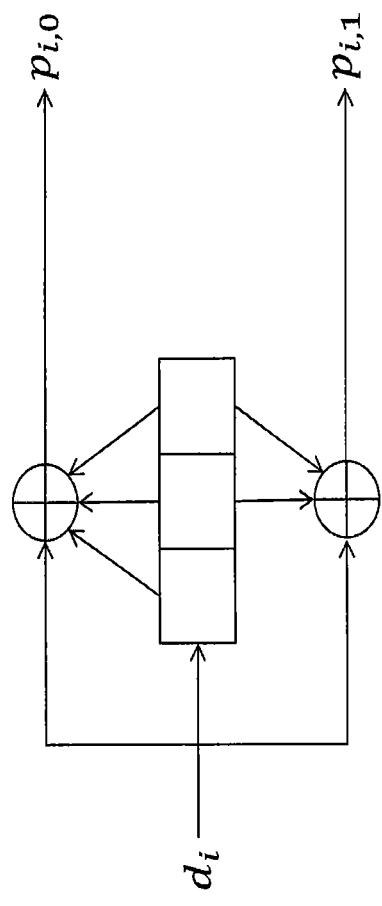
FIG. 6 is a block diagram depicting an encoder that may be used according to embodiments herein.

Turning to the encoders to encode the information bits. A rate-1/2, memory-3, non-systematic convolutional encoder is shown in FIG. 6. For every information bit $d_i$, the encoder produces two encoded information bits $p_{i,0}$ and $p_{i,1}$ giving a 1/2 coding rate.

The encoded information bits are determined based on the input information bit $d_i$ and the three memory bits being non-systematic bits.

Figure 7:
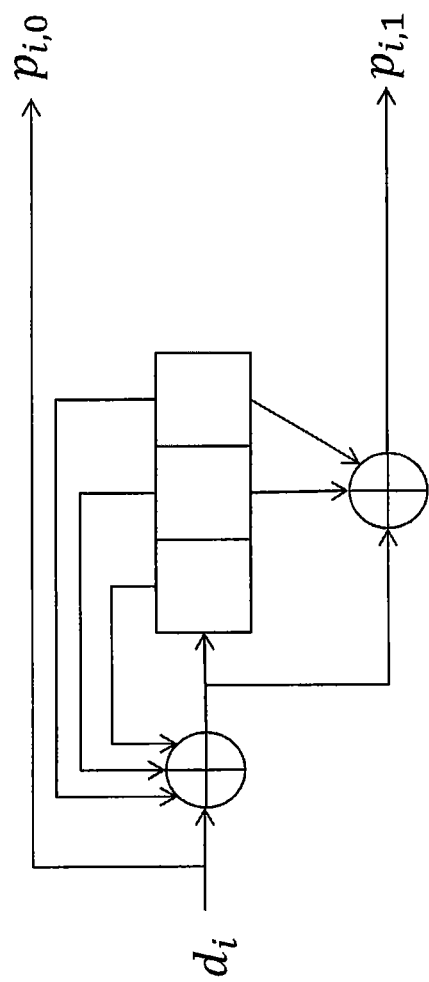
FIG. 7 is a block diagram depicting an encoder that may be used according to embodiments herein.

A rate-1/2, memory-3, systematic convolutional encoder is shown in FIG. 7. For every information bit $d_i$, the encoder produces two encoded information bits $p_{i,0}$ and $p_{i,1}$ giving a 1/2 coding rate. The encoded information bit $p_{i,0}$ is identical to the information $d_i$. It is thus not dependent of the memory bits. On the other hand, the encoded information bit $p_{i,1}$ is determined based on the input information bit $d_i$ and the three memory bits. The encoded information bit $p_{i,0}$ is referred to as the systematic bit, and the encoded information bit $p_{i,1}$ is referred to as the redundant bit or parity bit.

The two convolutional encoders shown in FIGS. 6 and 7, respectively, produce different codewords also referred to as encoded information bit sequences. However, they result in error protection codes of the same performance.

In many cases, terminating bits are used to force the convolutional code internal memory to be all-zero, or any pre-agreed upon pattern. For a non-systematic code shown in FIG. 6, a three-bit pattern of (0,0,0) can be used to bring the code internal memory to (0,0,0). For a systematic code shown in FIG. 7, the terminating bits are dependent of the information bit sequence itself. However, it is straightforward to determine the terminating bits.

Figure 8:
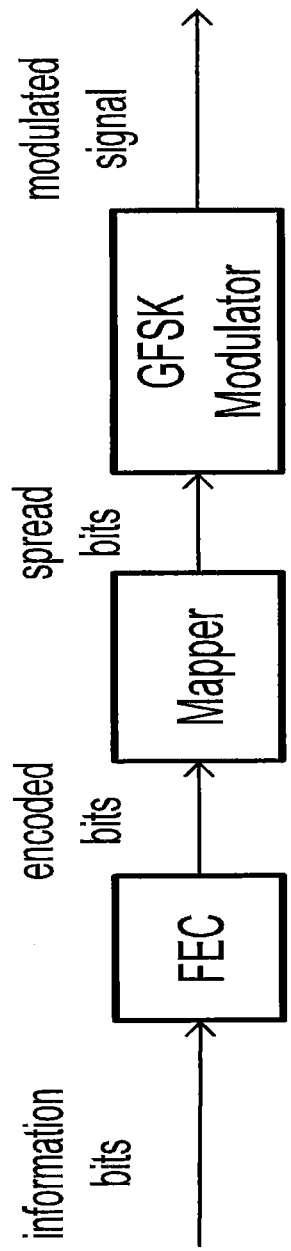
FIG. 8 is a transmitting sequence according to prior art.

A BLE transmitter in general is shown in FIG. 8. Information bits are fed to a Forward Error Correction (FEC) encoder. The FEC encoder performs the encoding operation using, for example, a convolutional code, resulting in encoded information bits. A Mapper performs a spreading operation, which maps an encoded information bit to a 4-bit pattern (1,1,0,0) or (0,0,1,1) for the encoded information bit value 0 and 1, respectively, into spread information bits. A Gaussian frequency-shift keying (GFSK) modulator performs modulation function using the spread bits to generate a modulated signal.

Figure 9:
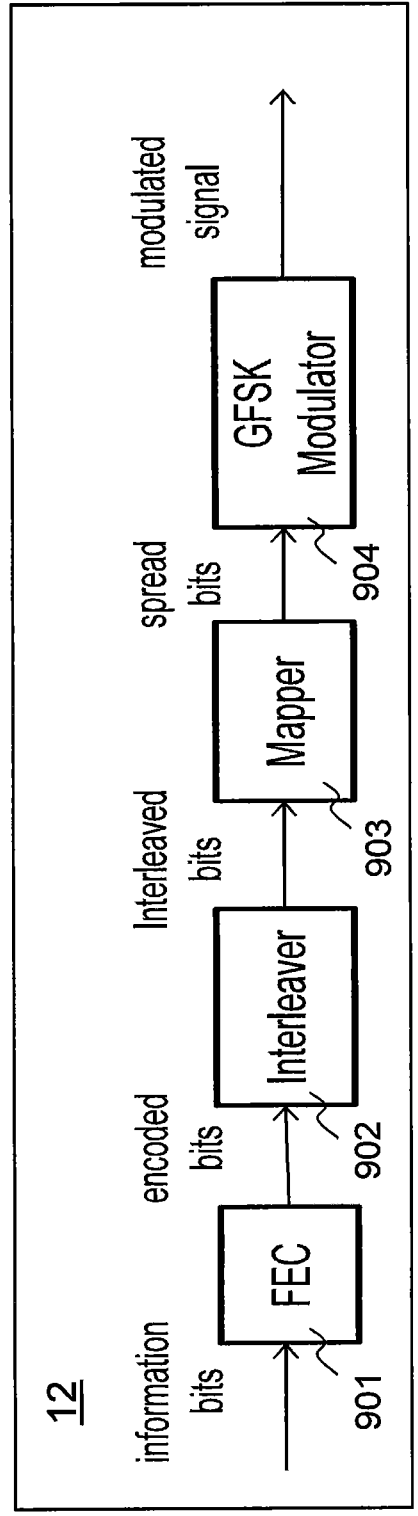
FIG. 9 is a transmitting sequence in a transmitting device according to embodiments herein.

An interleaver may be added to ensure robustness to bursty interference. This is illustrated in FIG. 9, showing an example of the transmitting device 12 according to embodiments herein. Information bits are fed to a FEC encoder 901. The FEC encoder 901 performs the encoding operation using, for example, a convolutional code, resulting in encoded information bits. An interleaver 902 rearranges the order of the encoded information bits into interleaved bits. A Mapper 903 performs a spreading operation, which maps an interleaved bit to a 4-bit pattern (1,1,0,0) or (0,0,1,1) for the interleaved bit value 0 and 1, respectively, into spread bits. A GFSK modulator 904 performs modulation function using the spread bits to generate a modulated signal.

Some of the different fields shown in FIGS. 4 and 5 may be encoded together into one codeword using, for example, the convolutional encoder shown in FIG. 6 or 7. For example, the information bits to be encoded together may include information bits in PDU Header, PDU Payload, CRC, and Term bits. The information bits to be encoded together may further include the Access Address. In the subsequent discussion the example of AA, PDU Header, PDU Payload, CRC, and Term bits being encoded together as one codeword is used herein. It should be understood that the embodiments herein apply to other cases as well.

Figure 10:
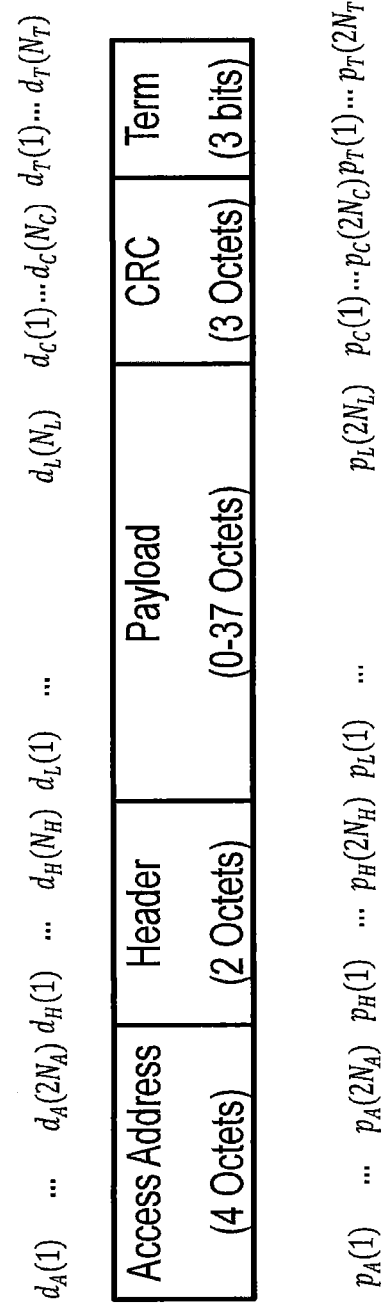
FIG. 10 is a block diagram depicting information bits of different types.

FIG. 10 illustrates information bits (d) and encoded information bits (p) from encoding the AA, the Header or PDU header, the Payload or PDU payload, the CRC, and the Term bits together in one codeword, where subscripts A, P, L, C, and T, represent information bits in the AA, PDU Header, PDU Payload, CRC, and Term fields, respectively, and the various N's present the lengths of the information bits in the different fields.

Figure 11:
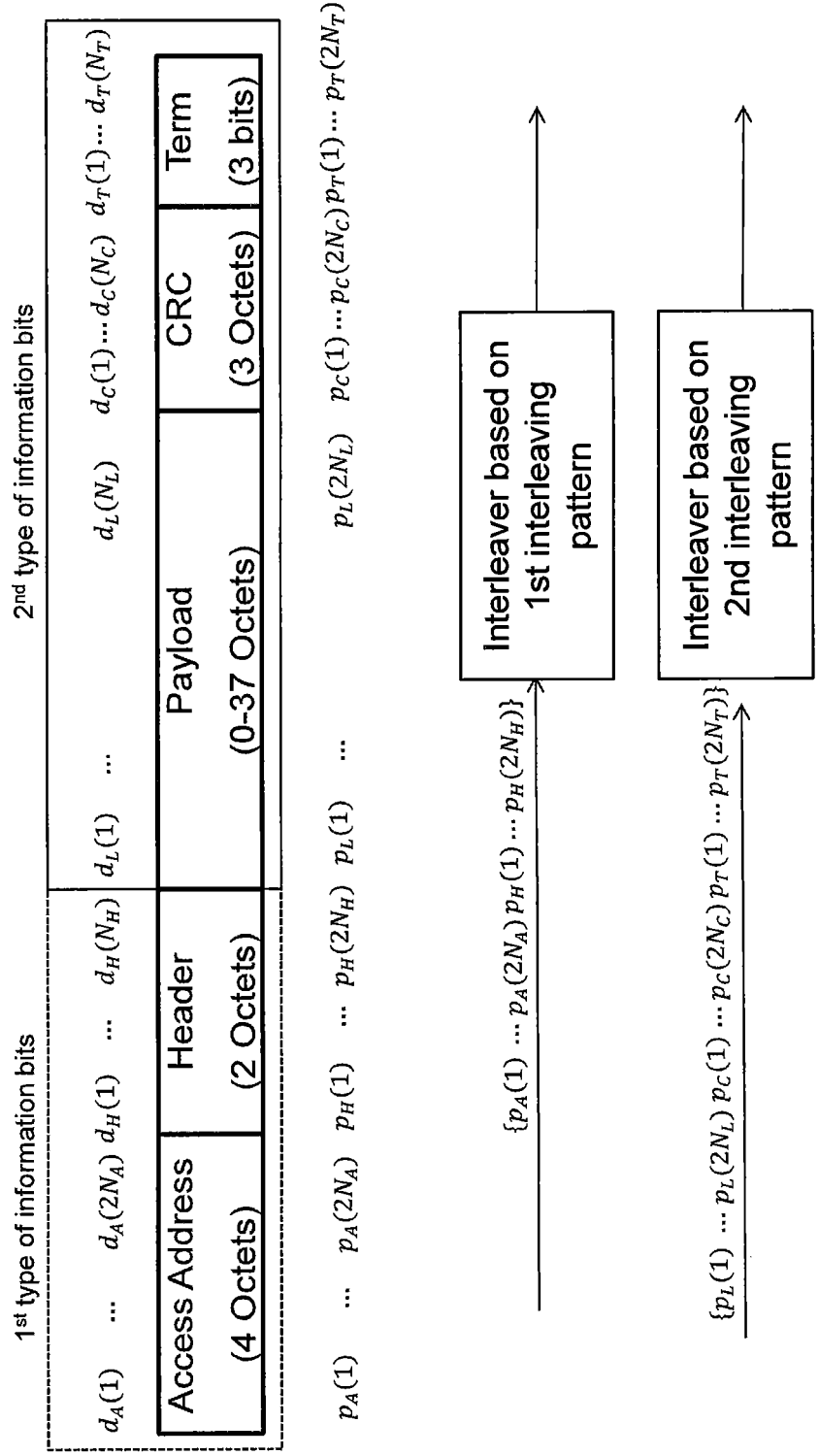
FIG. 11 is a block diagram depicting information bits fed to interleavers according to embodiments herein.

According to some embodiments, the AA bits, $(d_A(1), \ldots, d_A(N_A))$, and PDU Header bits, $(d_H(1), \ldots, d_H(N_H))$, are considered as the information bits of the first type of information, whereas the PDU Payload bits, $(d_L(1), \ldots, d_L(N_L))$, CRC bits, $(d_C(1), \ldots, d_C(N_C))$, and Term bits $(d_T(1), \ldots, d_T(N_T))$, are considered as the information bits of the second type of information. The encoded information bits of the first type of information, $(p_A(1), \ldots, p_A(2N_A), p_H(1), \ldots, p_H(2N_H))$, are interleaved using the first interleaving pattern, whereas the encoded information bits of the second type of information, $(p_L(1), \ldots, p_L(2N_L), p_C(1), \ldots, p_C(2N_C), p_T(1), \ldots,$ $p_T(2N_T)$), are interleaved using the second interleaving pattern. This is illustrated in FIG. 11 wherein the encoded information bits of the first type of information is fed to an interleaver based on the first interleaving pattern and the encoded information bits of the second type of information is fed to an interleaver based on the second interleaving pattern.

Figure 12:
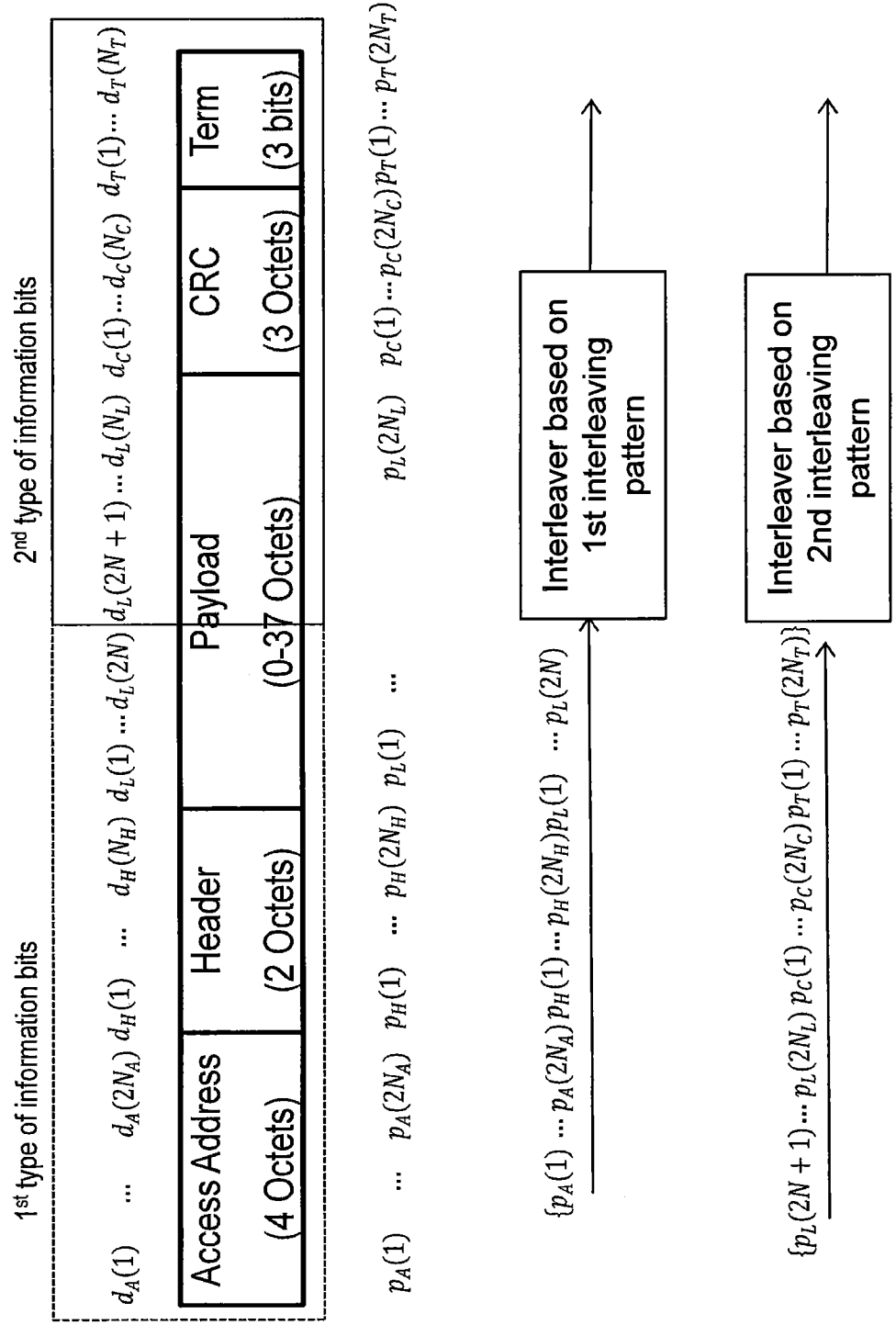
FIG. 12 is a block diagram depicting information bits fed to interleavers according to embodiments herein.

According to embodiments herein, the encoded information bits associated with the first N PDU Payload bits may be included as information bits of the first type of information, rather than as information bits of the second type of information. This is illustrated in FIG. 12. Including the encoded information bits associated with the first N PDU Payload bits to follow the same first interleaving pattern as the encoded information bits in the PDU header is advantageous in that the PDU header can be decoded more reliably when the decoding is entirely based on the encoded information bits associated with the first type of information. The size of payload is denoted by $N_L$. Here, the first N bits of the $N_L$ bits are information bits of the first type of information. Including the first N bits in the payload as information bits of the first type of information achieves better performance than without including them (i.e. only include Access Address and Header as the 1st type). This is a property of convolutional code. The decoder needs certain decision depth for good decoding performance. Including the first N bits in the payload as information bits of the first type of information gives the decision depth that may be needed for a convolutional decoder.

According to one aspect of embodiments herein, the interleaved bits produced using the first interleaving pattern may be transmitted before the interleaved bits produced using the second interleaving pattern. This reduces delay of the communication.

According to another aspect of embodiments herein, the first interleaving pattern is configured without using the information about the PDU Payload length, whereas the second interleaving pattern is configured using the information about the PDU Payload length.

According to another aspect of embodiments herein, the first interleaving pattern is configured without using the information about the codeword length, whereas the second interleaving pattern is configured using the information about the codeword length. The length information may be used to dimension the second interleaving pattern. In general, the round(sqrt(length)) may e.g. be used to determine the number of columns of a rectangular interleaving pattern.

Figure 13:
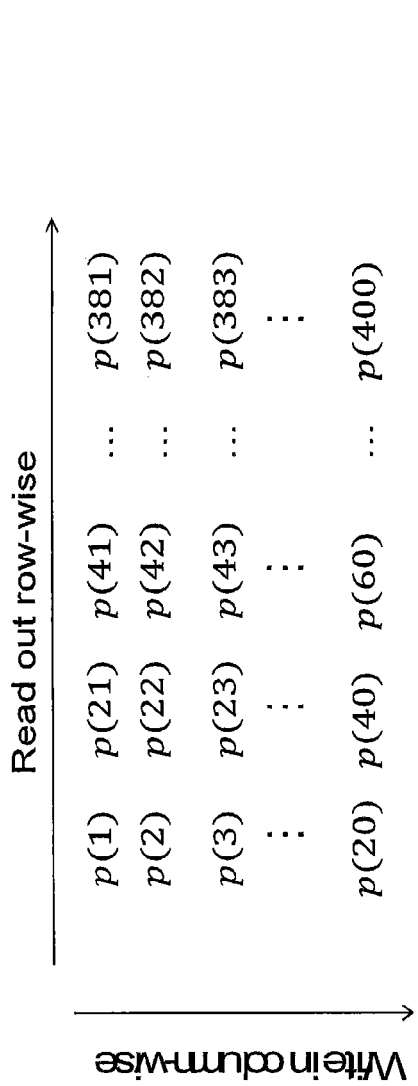
FIG. 13 is a matrix illustrating an interleaving pattern according to embodiments herein.

A special case of the first interleaving pattern is one that preserves the original ordering of the encoded information bits, i.e. the interleaved bit sequence is identical to original encoded information bit sequence. In this case, it is equivalent to omit an interleaver. Hence, part of the codeword is not interleaved, but the other part is interleaved A special case of the second interleaving pattern is a rectangular (or square) interleaving pattern. For example, assume that the number of information bits in the second type of information is 200. With a rate-1/2 coding, this gives 400 encoded information bits. A 20 by 20 rectangular interleaver as illustrated in FIG. 13 may then be used. In the example, the encoded information bits are written into a memory column-wise and read out row-wise. For an encoded information bit sequence of p(1), p(2), p(3), ..., p(400) input to the interleaver, this interleaver produces an interleaving pattern of p(1), p(21), p(41), ..., p(381), p(2), p(22), p(42), ..., p(382), p(20), p(40), p(60), ..., p(400). The example given rectangular interleaver is an example for the encoded information bits associated with the second type of information. An example for the interleaver for the encoded information bits associated with the first type of info bits is the one that e.g. preserves the original bit ordering.

According to another aspect of embodiments herein, the receiving device 10 decodes the information bits in e.g. the PDU Header without having a need to know the second interleaving pattern. After decoding the information bits of the first type of information, the receiving device 10 knows the configuration information such as PDU Payload length information and uses the configuration information to configure the second interleaver. For example, the PDU payload length may indicate the PDU Payload length is 25-byte long, i.e. 25*8=200 PDU Payload bits. Assume the first 27 PDU Payload bits are included as information bits of the first type of information (N=27). This results in second type of information bits including 200−27=173 PDU Payload bits; furthermore, information bits of the second type may include e.g. 24 CRC bits, and 3 terminating (term) bits. Thus, 200 information bits of the second type of information are encoded and after rate-1/2 encoding this gives 400 associated encoded information bits. The receiving device 10 then configures a second interleaving pattern for de-interleaving 400 encoded information bits.

Figure 14:
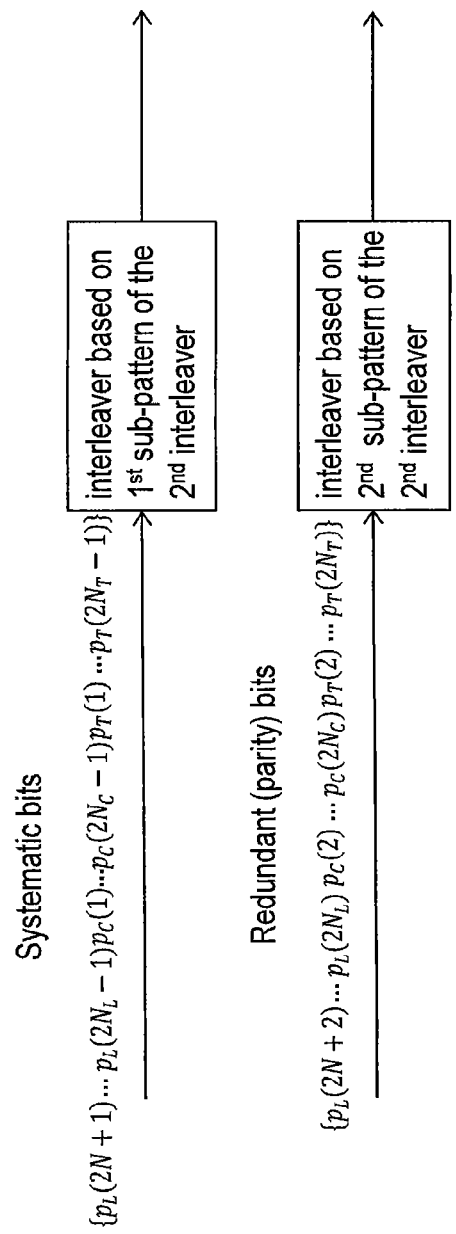
FIG. 14 is a block diagram depicting the second interleaver according to some embodiments herein.

In some embodiments, as stated above, when a systematic code is used, the second interleaving pattern may comprise a first subpattern that applies to the systematic bits and a second subpattern that applies to the redundant bits, which may be referred to as the parity bits. This is illustrated in FIG. 14. As shown among the encoded information bits associated with the second type of information bits, the odd-number bits are the systematic bits, which are identical to the original information bits, and the even-numbered bits are redundant bits. The systematic bit and redundant bits are defined, for example, according to FIG. 7. Separate interleaving subpatterns are used for the systematic bit sequence and redundant bit sequence, respectively, as shown in FIG. 14.

A special case of the first subpattern for the systematic bit sequence is one that preserves the original ordering of the systematic bit sequence, i.e. the interleaved bit sequence is identical to original bit sequence. In this case, it is equivalent to omit an interleaver.

In some embodiments, the second interleaving pattern may be designed to minimize the decoding delay. The encoded information bits associated with the last (ending) part of the second type of the information bits may then not be interleaved. This allows the decoder to decode most of the second type of information bits without having to wait for receiving the entire burst. For example, let p(1), p(2), p(3), ..., p(400) be the encoded information bits associated with the second type of information bits. p(1), p(2), p(3), ..., p(350) may be interleaved, while leaving p(351), p(352), ..., p(400) not interleaved. This allows the decoder to decode on the information bits associated with p(1), p(2), p(3), ..., p(350) without having to wait for receiving the entire burst, i.e. without having to wait for receiving encoded information bits p(351), p(352), ..., p(400).

Figure 15:
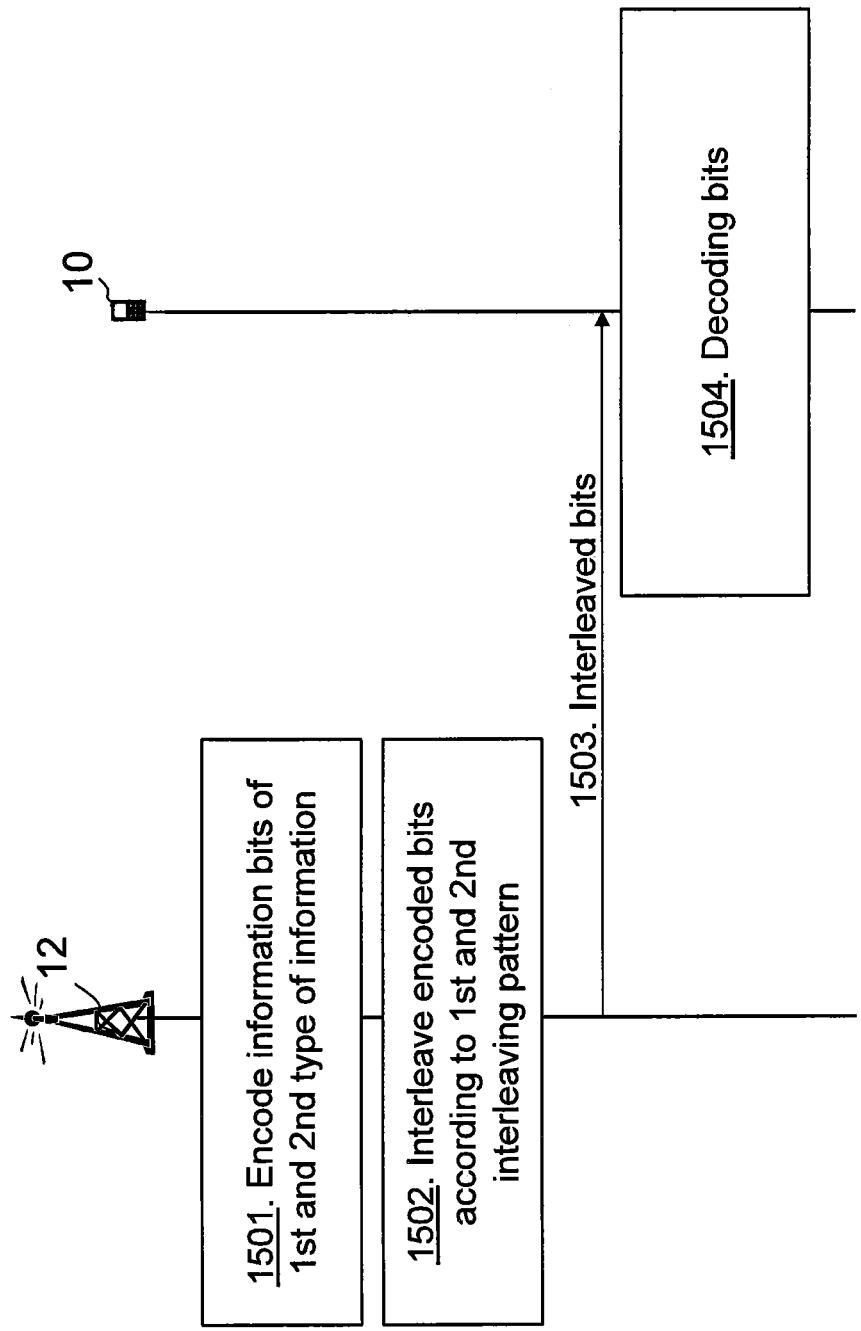
FIG. 15 is a combined flowchart and signalling scheme according to embodiments herein.

FIG. 15 is a combined signalling and flowchart scheme according to embodiments herein.

Action 1501. The transmitting device 12 encodes information bits of the first type of information and the second type of information. A first type of information bits (e.g. PDU Header) and a second type of information bits (e.g. PDU Payload) may be encoded together to produce a codeword. Thus, the first type of information bits or information bits of a first type of information, e.g. information bits in the PDU Header, and the second type of information bits or information bits of a first type of information, e.g. information bits in the PDU Payload, are encoded together to produce the codeword with a bit ordering also referred to herein as encoded information bits.

Action 1502. The transmitting device 12 interleaves the encoded information bits according to the first interleaving pattern and the second interleaving pattern. An interleaved encoded information bits sequence is generated. An interleaver in the transmitting device 12 may be used to change the bit ordering in the codeword, according to the first and second interleaving pattern, to add robustness to bursty interference. The first interleaving pattern is designed to allow the information bits of the first type of information to be decoded without knowing the length of the codeword, i.e. the number of total encoded information bits. According to embodiments herein, to allow the receiving device 10 to decode the information bits of the first type of information, the encoded information bits associated with the information bits of the first type of information are fed through the first interleaving pattern that is not dependent of the length or number of information bits of the second type of information. Thus, the interleaver may be configured without knowledge of the second type of information bits.

Furthermore, according to embodiments herein, when convolutional codes are used, either a non-systematic or a systematic code, a number of encoded information bits associated with a first or beginning part of the second type of information bits are also interleaved according to the first interleaving pattern.

In some embodiments, when the systematic code is used, the second interleaving pattern may comprise the first subpattern that applies to the systematic bits and the second subpattern that applies to redundant bits. The second interleaving pattern may be designed to minimize a decoding delay. According to embodiments herein, encoded information bits associated with a last, or ending, part of the second type of the information bits may not be interleaved.

Action 1503. The transmitting device 12 transmits the interleaved encoded information bit sequence to the receiving device 10.

Action 1504. The receiving device 10 decodes and interleaves the received information bits. E.g. after decoding the first type of information, the receiving device 10 obtains necessary information from the decoded information bits of the first type of information to configure the interleaver of the receiving device 10, e.g. configuring the interleaving pattern, required for decoding the information bits of the second type of information of the received information bits.

The information bits of the first type of information may include information bits in the PDU Header that carries, in addition to other information, the information about the PDU Payload length. Hence, embodiments herein avoid that the PDU Header is delay due to interleaving. The information bits of the first type of information may further include information bits of the Access Address information that identifies a communication link between the transmitting device 12 and the receiving device 10. The information bits of the second type of information comprises e.g. information bits in the PDU Payload, CRC bits and/or terminating bits.

Earlier interleaving need to be configured according to codeword length, which is determined by PDU Payload size. Instead, according to embodiments herein e.g. the PDU Header is decoded sufficiently early without having to wait for receiving the entire codeword due to the structure of the interleaving pattern. Hence, an advantage with embodiments herein is to add considerably higher robustness to bursty interference, by adding an interleaving pattern, while allowing certain information to be decoded early without having to wait for receiving the entire codeword due to the structure of the interleaving pattern. Embodiments herein further allow some information bits to be decoded without knowing the codeword length. This will lead to an improved performance of the wireless communications network.

Figure 16:
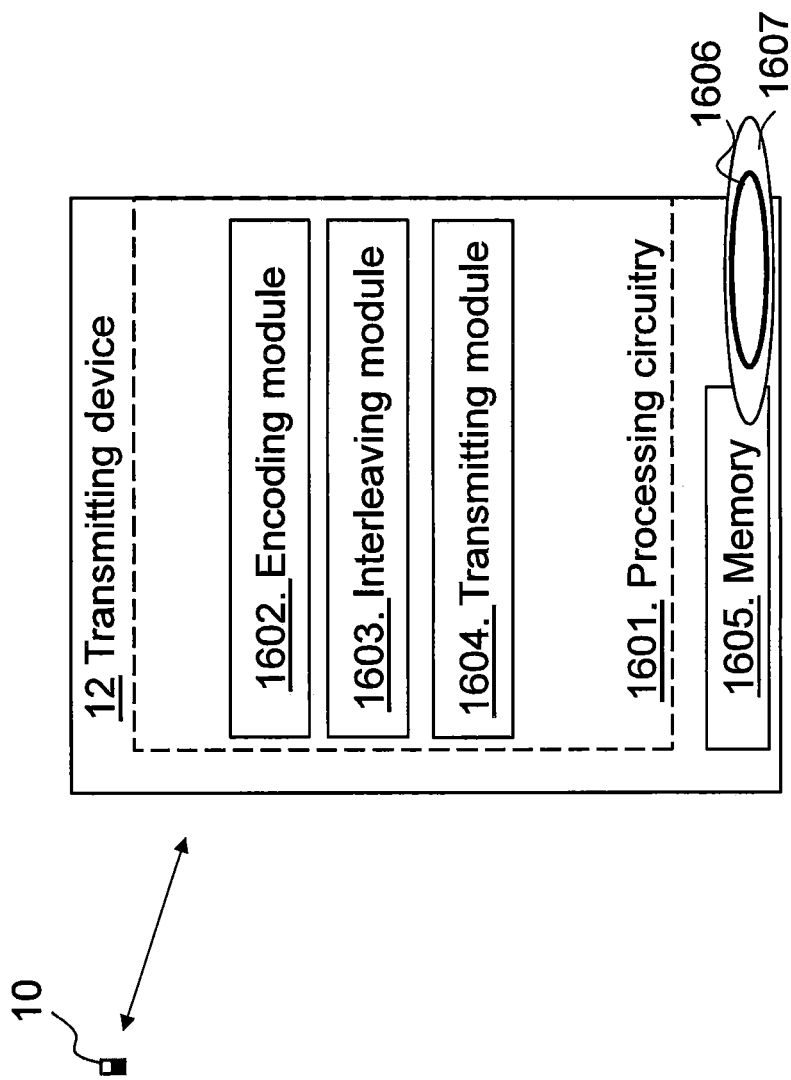
FIG. 16 is a block diagram depicting a transmitting device according to embodiments herein.

FIG. 16 is a block diagram depicting the transmitting device 12 for transmitting information bits to the receiving device 10 in the wireless communication network 1.

The transmitting device 12 is configured to encode information bits of the first type of information and the second type of information into the codeword.

The transmitting device 12 is configured to interleave the encoded information bits of the first type of information according to the first interleaving pattern and the encoded information bits of the second type of information according to the second interleaving pattern. The transmitting device 12 is thereby configured to change the order of the encoded information bits of at least one of the first type of information and the second type of information in the codeword and to generate the interleaved encoded information bit sequence, wherein at least one of the first and the second interleaving pattern is designed to allow the information bits of the first type of information to be decoded without knowing the length of the codeword.

The transmitting device 12 is further configured to transmit the interleaved encoded information bit sequence to the receiving device 10.

The first interleaving pattern may be configured independently of the length of the codeword and the second interleaving pattern is configured dependently of the length of the codeword. The first interleaving pattern may be configured to preserve the original ordering of the encoded information bits. The first type of information may comprise information in a PDU Header of a packet, which PDU header carries information about a PDU Payload length. The second type of information may comprise information in a PDU Payload field of a packet. The second interleaving pattern may comprise the first subpattern configured to apply to one or more systematic bits and the second subpattern configured to apply to one or more redundant bits. The first subpattern for the one or more systematic bits may be configured to preserve the original ordering of the bit sequence of the one or more systematic bits. The second interleaving pattern may be configured to not interleave encoded information bits associated with one or more of ending information bits of the second type of the information.

The transmitting device 12 may be configured to perform the methods disclosed herein. The transmitting device 12 may comprise processing circuitry 1601 to perform the methods herein.

The transmitting device 12 may comprise an encoding module 1602. The processing circuitry 1601 and/or the encoding module 1602 may be configured to encode the first and second information bits together to produce the codeword with a bit sequence. The processing circuitry 1601 and/or the encoding module 1602 may be configured to encode information bits of the first type of information and the second type of information into the codeword.

The transmitting device 12 may further comprise an interleaving module 1603, e.g. an interleaver. The processing circuitry 1601 and/or the interleaving module 1603 may be configured to change bit ordering of the bit sequence in the codeword according to the first and/or the second interleaving pattern to add robustness to bursty interference. The processing circuitry 1601 and/or the interleaving module 1603 may be configured to interleave the encoded information bits of the first type of information according to the first interleaving pattern and the encoded information bits of the second type of information according to the second interleaving pattern. The processing circuitry 1601 and/or the interleaving module 1603 is thereby configured to change the order of the encoded information bits of at least one of the first type of information and the second type of information in the codeword and to generate the interleaved encoded information bit sequence, wherein at least one of the first and the second interleaving pattern is designed to allow the information bits of the first type of information to be decoded without knowing the length of the codeword.

According to embodiments herein, the interleaving pattern may be designed to allow the first type of information bits to be decoded without knowing the length of the codeword, i.e. the number of total encoded information bits. According to embodiments herein, to allow the receiving device 10 to decode the first type of information bits, the encoded information bits associated with the first type of information bits have the first interleaving pattern that is not dependent of the length of the second type of information bits such as the PDU Payload length. Furthermore, according to embodiments herein, when convolutional codes are used, either a non-systematic or a systematic code, a number of encoded information bits associated with a first or beginning information bits of the second type of information bits are also interleaved according to the first interleaving pattern. The first type of information bits may include the PDU Header that carries, in addition to other information, the information about the PDU Payload length. The first type of information bits may further include the Access Address information that identifies a communication link between the transmitting device and the receiving device. The second type of information bits includes e.g. the PDU Payload. The second type of information bits may further include at least one of CRC bits and terminating bits.

In some embodiments, when the systematic code is used, the second interleaving pattern may comprise the first sub-pattern that applies to systematic bits and the second sub-pattern that applies to redundant bits, which may be referred to as parity bits. The second interleaving pattern may be designed to minimize a decoding delay. According to embodiments herein, encoded information bits associated with a last, or ending, part of the second type of the information bits may not be interleaved.

The transmitting device 12 may comprise a transmitting module 1604. The processing circuitry 1601 and/or the transmitting module 1604 may be configured to transmit the interleaved encoded information bit sequence to the receiving device 10.

The transmitting device 12 may further comprise a memory 1605. The memory 1605 comprises one or more units to be used to store data on, such as interleaving patterns, codewords, code, bit sequences, applications to perform the methods disclosed herein when being executed, and similar.

The methods according to the embodiments described herein for the transmitting device 12 are respectively implemented by means of e.g. a computer program 1606 or a computer program product, comprising instructions, i.e., software code portions, which, when executed on at least one processor, cause the at least one processor to carry out the actions described herein, as performed by the transmitting device 12. The computer program 1606 may be stored on a computer-readable storage medium 1607, e.g. a disc or similar. The computer-readable storage medium 1607, having stored thereon the computer program 1606, may comprise the instructions which, when executed on at least one processor, cause the at least one processor to carry out the actions described herein, as performed by the transmitting device 12. In some embodiments, the computer-readable storage medium 1607 may be a non-transitory computer-readable storage medium.

Figure 17:
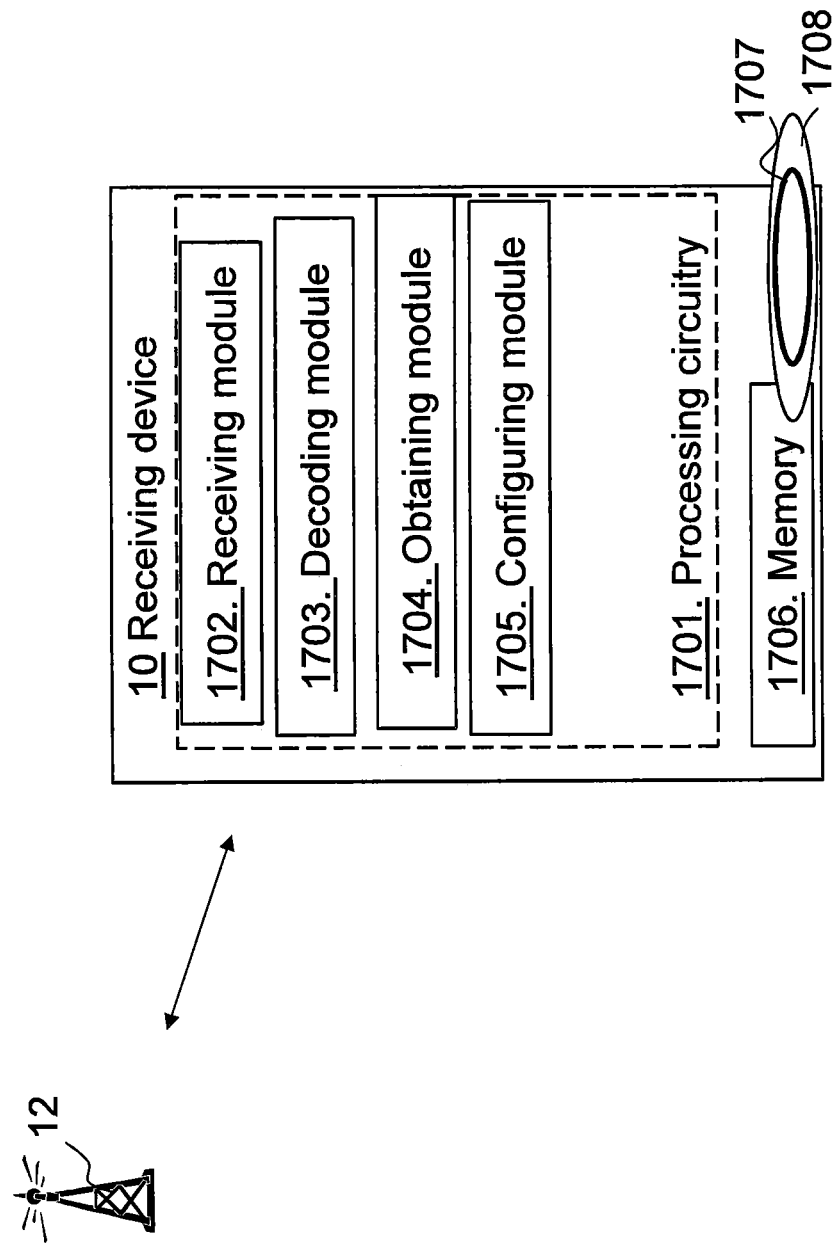
FIG. 17 is a block diagram depicting a receiving device according to embodiments herein.

FIG. 17 is a block diagram depicting the receiving device 10. The receiving device 10 may be configured to perform the methods disclosed herein. FIG. 17 shows the receiving device 10 for receiving information bits from the transmitting device 12 in the wireless communication network 1.

The receiving device 10 is configured to receive information bits of the first type of information and the second type of information.

The receiving device 10 is further configured to decode the received information bits of the first type of information.

The receiving device 10 is also configured to obtain the configuring information from the decoded information bits.

The receiving device 10 is in addition configured to configure the interleaving pattern required to decode the information bits of the second type of information based on the obtained configuring information.

The receiving device 10 is also configured to decode the information bits of the second type of information received using the configured interleaving pattern.

The obtained configuring information may comprise information of a PDU Payload length.

The receiving device 10 may comprise processing circuitry 1701 to perform the methods herein.

The receiving device 10 may comprise a receiving module 1702. The processing circuitry 1701 and/or the receiving module 1702 may be configured to receive data, a bit sequence, from the transmitting device 12. The processing circuitry 1701 and/or the receiving module 1702 may be configured to receive information bits of the first type of information and the second type of information The receiving device 10 may comprise a decoding module 1703. The processing circuitry 1701 and/or the decoding module 1703 may be configured to decode the received data, or bit sequence. E.g. decode at least part of the codeword comprising first and second type information bits. The processing circuitry 1701 and/or the decoding module 1703 may be configured to decode the received information bits of the first type of information.

The receiving device 10 may comprise an obtaining module 1704. The processing circuitry 1701 and/or the obtaining module 1704 may be configured to obtain the configuring information from the decoded information bits. The processing circuitry 1701 and/or the obtaining module 1704 may be configured to obtain the configuring information from the decoded information bits.

The receiving device 10 may comprise a configuring module 1705. The processing circuitry 1701 and/or the configuring module 1705 may be configured, after decoding the first type of information, to configure an interleaver of the receiving device 10, e.g. configuring the interleaving pattern, required for decoding the second type of information bits. The processing circuitry 1701 and/or the configuring module 1705 may be configured to configure the interleaving pattern required to decode the information bits of the second type of information based on the obtained configuring information.

The processing circuitry 1701 and/or the decoding module 1703 may also be configured to decode the information bits of the second type of information received using the configured interleaving pattern.

The receiving device 10 may further comprise a memory 1706. The memory 1706 comprises one or more units to be used to store data on, such as interleaving patterns, codewords, code, bit sequences, applications to perform the methods disclosed herein when being executed, and similar.

The methods according to the embodiments described herein for the receiving device 10 are respectively implemented by means of e.g. a computer program 1707 or a computer program product, comprising instructions, i.e., software code portions, which, when executed on at least one processor, cause the at least one processor to carry out the actions described herein, as performed by the receiving device 10. The computer program 1707 may be stored on a computer-readable storage medium 1708, e.g. a disc or similar. The computer-readable storage medium 1708, having stored thereon the computer program 1707, may comprise the instructions which, when executed on at least one processor, cause the at least one processor to carry out the actions described herein, as performed by the receiving device 10. In some embodiments, the computer-readable storage medium 1708 may be a non-transitory computer-readable storage medium.

Those skilled in the art will also appreciate that the various "circuits" or modules described may refer to a combination of analogue and digital circuits, and/or one or more processors configured with software and/or firmware, e.g., stored in memory, that, when executed by the one or more processors, perform as described above. One or more of these processors, as well as the other digital hardware, may be included in a single application-specific integrated circuit (ASIC), or several processors and various digital hardware may be distributed among several separate components, whether individually packaged or assembled into a system-on-a-chip (SoC).

Alternatively, several of the functional elements of the processing circuitry discussed may be provided through the use of dedicated hardware, while others are provided with hardware for executing software, in association with the appropriate software or firmware. Thus, the term "processor" or "controller" as used herein does not exclusively refer to hardware capable of executing software and may implicitly include, without limitation, digital signal processor (DSP) hardware, read-only memory (ROM) for storing software, random-access memory for storing software and/or program or application data, and non-volatile memory. Other hardware, conventional and/or custom, may also be included. Designers of communications devices will appreciate the cost, performance, and maintenance tradeoffs inherent in these design choices.

It will be appreciated that the foregoing description and the accompanying drawings represent non-limiting examples of the methods and apparatus taught herein. As such, the apparatus and techniques taught herein are not limited by the foregoing description and accompanying drawings. Instead, the embodiments herein are limited only by the following claims and their legal equivalents.

The invention claimed is:

1. A method performed by a transmitting device for transmitting information bits to a receiving device in a wireless communication network, the method comprising:
encoding information bits of a first type of information and a second type of information into a codeword;
interleaving the encoded information bits of the first type of information according to a first interleaving pattern and the encoded information bits of the second type of information according to a second interleaving pattern, changing an order of at least one of the encoded information bits of the first type of information and the second type of information in the codeword to generate an interleaved encoded information bit sequence, wherein at least one of the first interleaving pattern and the second interleaving pattern enables the information bits of the first type of information to be decoded without knowing a length of the codeword; and
transmitting the interleaved encoded information bit sequence to the receiving device.

2. The method according to claim 1, wherein the first interleaving pattern is independent of the length of the codeword and the second interleaving pattern is dependent of the length of the codeword.

3. The method according to claim 1, wherein the first interleaving pattern is one that preserves an original ordering of the encoded information bits.

4. The method according to claim 1, wherein the first type of information comprises information in a Protocol Data Unit, PDU, Header of a packet, wherein the PDU header carries information about a PDU Payload length.

5. The method according to claim 1, wherein the second type of information comprises information in a Protocol Data Unit, PDU, Payload field of a packet.

6. The method according to claim 1, wherein the second interleaving pattern comprises a first subpattern that applies to one or more systematic bits and a second subpattern that applies to one or more redundant bits.

7. The method according to claim 6, wherein the first subpattern for the one or more systematic bits is one that preserves an original ordering of a bit sequence of the one or more systematic bits.

8. The method according to claim 1, wherein the second interleaving pattern does not interleave encoded information bits associated with one or more of ending information bits of the second type of the information.

9. A method performed by a receiving device for receiving information bits from a transmitting device in a wireless communication network; the method comprising:
receiving information bits of a first type of information and a second type of information;
decoding the information bits of the first type of information;
obtaining a configuring information from the decoded information bits;
configuring an interleaving pattern required to decode the information bits of the second type of information based on the obtained configuring information; and
decoding the information bits of the second type of information received using the configured interleaving pattern.

10. The method according to claim 9, wherein the obtained configuring information comprises information of a Protocol Data Unit, PDU, Payload length.

11. A transmitting device for transmitting information bits to a receiving device in a wireless communication network; the transmitting device being configured to:
encode information bits of a first type of information and a second type of information into a codeword;
interleave the encoded information bits of the first type of information according to a first interleaving pattern and the encoded information bits of the second type of information according to a second interleaving pattern, changing an order of the encoded information bits of at least one of the first type of information and the second type of information in the codeword to generate an interleaved encoded information bit sequence, wherein at least one of the first interleaving pattern and the second interleaving pattern enables the information bits of the first type of information to be decoded without knowing a length of the codeword; and transmit the interleaved encoded information bit sequence to the receiving device.

12. The transmitting device according to claim 11, wherein the first interleaving pattern is configured independently of the length of the codeword and the second interleaving pattern is configured dependently of the length of the codeword.

13. The transmitting device according to claim 11, wherein the first interleaving pattern is configured to preserve an original ordering of the encoded information bits.

14. The transmitting device according to claim 11, wherein the first type of information comprises information in a Protocol Data Unit, PDU, Header of a packet, wherein the PDU header carries information about a PDU Payload length.

15. The transmitting device according to claim 11, wherein the second type of information comprises information in a Protocol Data Unit, PDU, Payload field of a packet.

16. The transmitting device according to claim 11, wherein the second interleaving pattern comprises a first subpattern configured to apply to one or more systematic bits and a second subpattern configured to apply to one or more redundant bits.

17. The transmitting device according to claim 16, wherein the first subpattern for the one or more systematic bits is configured to preserve an original ordering of a bit sequence of the one or more systematic bits.

18. The transmitting device according to claim 11, wherein the second interleaving pattern is configured to not interleave encoded information bits associated with one or more of ending information bits of the second type of the information.

19. A receiving device for receiving information bits from a transmitting device in a wireless communication network the receiving device being configured to:
receive information bits of a first type of information and a second type of information;
decode the information bits of the first type of information;
obtain a configuring information from the decoded information bits;
configure an interleaving pattern required to decode the information bits of the second type of information based on the obtained configuring information; and
decode the information bits of the second type of information received using the configured interleaving pattern.

20. The receiving device according to claim 19, wherein the obtained configuring information comprises information of a Protocol Data Unit, PDU, Payload length.

21. A computer program product comprising a non-transitory computer readable storage medium storing instructions, which, when executed on at least one processor, cause the at least one processor to carry out the method according to claim 1.

* * * * *